(12) United States Patent
Kuscher et al.

(10) Patent No.: US 10,235,846 B2
(45) Date of Patent: *Mar. 19, 2019

(54) AUTOMATICALLY ACTIVATED VISUAL INDICATORS ON COMPUTING DEVICE

(71) Applicant: GOOGLE LLC, Mountain View, CA (US)

(72) Inventors: Alexander Friedrich Kuscher, San Francisco, CA (US); Simon Arscott, San Francisco, CA (US); Adam Rodriguez, San Francisco, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,636

(22) Filed: Dec. 20, 2017

(65) Prior Publication Data

US 2018/0137719 A1 May 17, 2018

Related U.S. Application Data

(63) Continuation of application No. 14/866,081, filed on Sep. 25, 2015, now Pat. No. 9,881,465, which is a
(Continued)

(51) Int. Cl.
*G08B 5/36* (2006.01)
*G06F 1/16* (2006.01)
(Continued)

(52) U.S. Cl.
CPC ........... *G08B 5/36* (2013.01); *G01R 31/3682* (2013.01); *G06F 1/165* (2013.01); *G06F 1/1616* (2013.01);
(Continued)

(58) Field of Classification Search
CPC ....... G09G 2310/0232; G09G 2310/04; G09G 2320/0686; G09G 3/20; G06F 1/1616;
(Continued)

(56) References Cited

U.S. PATENT DOCUMENTS 6,014,141 A * 1/2000 Klein .................... G06F 1/1616
345/3.1
6,275,162 B1 8/2001 Lo et al.
(Continued)

FOREIGN PATENT DOCUMENTS

CN 105259974 A 1/2016
EP 2966538 A1 1/2016

OTHER PUBLICATIONS

International Search Report and Written Opinion received for PCT Patent Application No. PCT/US2015/039229, dated Oct. 16, 2015, 15 pages.
(Continued)

*Primary Examiner* — Mirza Alam
(74) *Attorney, Agent, or Firm* — Brake Hughes Bellermann LLP

(57) ABSTRACT

A computing device includes one or more memory devices storing executable instructions, one or more processors configured to execute the instructions, a programmable display screen configured to display text-based information, a user activity sensor, a battery configured to provide power to the one or more processors, and a battery status visual indicator. The battery status indicator is located on a surface of the computing device and is configured to display, in response an indication from the user activity sensor of an interaction by a user with the computing device, non-text-based information indicating a status of the battery.

13 Claims, 6 Drawing Sheets

Related U.S. Application Data continuation of application No. 14/328,278, filed on Jul. 10, 2014, now Pat. No. 9,153,106.

(51) Int. Cl.
  *G01R 31/36* (2019.01)
  *G10L 15/22* (2006.01)
(52) U.S. Cl.
  CPC ...... *G10L 15/22* (2013.01); *G09G 2310/0232* (2013.01); *G10L 2015/223* (2013.01); *Y02B 70/126* (2013.01)
(58) Field of Classification Search
  CPC ........ G06F 1/165; G06F 3/147; G06F 1/3212; Y02B 60/1292; G01R 31/3682; G06K 17/0006
  USPC ............. 340/636.1, 691.1, 815.45, 971, 901, 340/815.4, 815.53; 713/835; 345/628, 345/690.84; 320/137
  See application file for complete search history.

(56) References Cited

U.S. PATENT DOCUMENTS

| | | | |
|---|---|---|---|
| 9,100,494 B1* | 8/2015 | Rao | G06F 21/32 |
| 2002/0180767 A1* | 12/2002 | Northway | G06F 1/1626 345/698 |
| 2003/0169178 A1* | 9/2003 | Jensen | F21S 9/02 340/815.5 |
| 2005/0062612 A1 | 3/2005 | Smith et al. | |
| 2005/0143137 A1 | 6/2005 | Matsunaga et al. | |
| 2006/0074658 A1 | 4/2006 | Chadha | |
| 2006/0220897 A1 | 10/2006 | Cheng | |
| 2009/0021510 A1* | 1/2009 | Klintstrom | H04M 1/22 345/214 |
| 2009/0115636 A1 | 5/2009 | Shibata | |
| 2009/0303072 A1 | 12/2009 | Gilling et al. | |
| 2010/0090847 A1 | 4/2010 | Hendren et al. | |
| 2010/0207871 A1* | 8/2010 | Reponen | G06F 1/1626 345/156 |
| 2012/0254634 A1 | 10/2012 | Chakra et al. | |
| 2012/0289287 A1 | 11/2012 | Kokubo | |
| 2012/0317432 A1* | 12/2012 | Assad | G06F 1/3212 713/340 |
| 2013/0223635 A1 | 8/2013 | Singer et al. | |
| 2013/0262890 A1 | 10/2013 | Marshall et al. | |
| 2014/0092140 A1* | 4/2014 | Wadhwa | G09G 3/20 345/660 |
| 2014/0176475 A1 | 6/2014 | Myers et al. | |
| 2014/0181535 A1* | 6/2014 | Smith | H04W 12/06 713/300 |
| 2015/0205358 A1 | 7/2015 | Lyren | |
| 2016/0012686 A1 | 1/2016 | Kuscher et al. | |

OTHER PUBLICATIONS

Extended European Search Report received for European Patent Application No. 15175643.4, dated Oct. 19, 2015, 8 pages.
"MacBook Pro 5,1 Battery Indicator Lights", available online at <https://www.youtube.com/watch?v=lsr3wRY4IvY>, Jul. 6, 2013, 1 page.
"What is This Button on my Macbook?", available online at <https://apple.stackexchange.com/questions/47586/what-is-this-button-on-my-macbook>, Apr. 4, 2012, 2 pages.
U.S. Appl. No. 14/328,278, filed Jul. 10, 2014, Issued.
U.S. Appl. No. 14/866,081, filed Sep. 25, 2015, Allowed.
Communication pursuant to Article 94(3) EPC for European Application No. 15175643.4, dated Sep. 25, 2018, 5 pages.

* cited by examiner

AUTOMATICALLY ACTIVATED VISUAL INDICATORS ON COMPUTING DEVICE

CROSS-REFERENCE TO RELATED APPLICATION

This application is a Continuation of, and claims priority to U.S. application Ser. No. 14/866,081, filed Sep. 25, 2015, which claims priority to U.S. application Ser. No. 14/328,278, filed Jul. 10, 2014, now U.S. Pat. No. 9,153,106, the disclosures of which are incorporated herein in their entireties.

BACKGROUND

Computing devices such as laptops may have a light-emitting diode (LED) indicator on the front or back of the device, which may indicate an operating status of the device, such as the device being on, being in sleep mode, or charging. This LED indicator has a single color LED, and is driven by internal CPU controllers. However, the internal CPU controllers do not have the capabilities of controlling the LED indicator in a configurable manner to indicate many types of information besides the operating status of a computer.

In addition, the LED indicator may have a brightness that is suitable for daytime usage, but which may be annoyingly bright when using the computing device in a dimly lit room.

SUMMARY

In a first general aspect, a computing device includes one or more memory devices storing executable instructions, one or more processors configured to execute the instructions, a programmable display screen configured to display text-based information, a user activity sensor, a battery configured to provide power to the one or more processors, and a battery status visual indicator. The battery status indicator is located on a surface of the computing device and is configured to display, in response an indication from the user activity sensor of an interaction by a user with the computing device, non-text-based information indicating a status of the battery.

Implementations can include one or more of the following features, alone or in combination. For example, the user activity sensor can include an accelerometer configured to detect movement of the computing device in response to the interaction by the user with the computing device, and the indication can include an indication of the detected movement. The user activity sensor can include a microphone and a voice recognition engine, which together are configured to detect predetermined words spoken by the user, and the indication from the user activity sensor can include an indication of that the predetermined words have been detected by the voice recognition engine The battery status visual indicator can include a light emitting diode. The surface on which the battery status visual indicator is located may not include the programmable display screen.

The computing device can be a laptop computer that can include a base portion and a display portion, the display portion having a first surface that can include the programmable display screen and having a second surface opposite to the first surface that can include the battery status visual indicator.

The battery status visual indicator can include a plurality of segments, with each segment being configured to display at least four different colors, and the colors displayed by segments of the battery status visual indicator can be programmable, though execution of the instructions by the one or more processors, to display non-text-based information. The plurality of segments each can be generally-rectangular and the plurality of segments can be arranged in a line, and the plurality of segments can be contiguous in the line.

The computing device can be a laptop computer that can include a base portion and a display portion, the display portion having a first surface that can include the programmable display screen and having a second surface opposite to the first surface that can include the battery status visual indicator, and the line of segments can span a length that is greater than 50% of a width of the display portion and can have a height that is less than 10% of height of the display portion. Each segment can be configured to display at least eight different colors, or at least 256 different colors.

The sensor can be configured to generate a signal to one of the processors in response to an indication of an interaction by a user with the computing device while the least one of the one or more processors is in a low power sleep state, and the battery status visual indicator can be configured to display the non-text-based information indicating a status of the battery while at least one of the one or more processors is in a low power sleep state.

The computing device can include a light sensor configured to generate a signal when an amount of light striking the sensor is lower than a threshold amount, and the battery status visual indicator can be configured to turn off in response to receiving the signal and can be configured to turn on and display, for a predetermined time period, in response to the indication from the user activity sensor of an interaction by a user with the computing device, the non-text-based information indicating a status of the battery.

In another general aspect, a method of displaying non-text-based battery status information via a battery status indicator located on a surface of a computing device that does not include a programmable display screen configured to display text-based information is provided. The method includes determining, while the computing device is in a low power sleep state, that the computing device has experienced an interaction with a user, and, in response to the determination, displaying the non-text-based battery status information via a battery status indicator.

Implementations can include one or more of the following features. For example, determining that the computing device has experienced an interaction with a user can include determining that an accelerometer housed by the computing device has detected an acceleration of the computing device. Determining that the computing device has experienced an interaction with a user can include determining that predetermined words have been spoken by the user. Displaying the battery status information can occur while the computing device is in a low power sleep state.

In another general aspect, a computing device includes one or more memory devices storing executable instructions, one or more processors configured to execute the instructions, a programmable display screen configured to display text-based information, a user activity sensor configured to detect activity of a user of the computing device while the computing device is in a low power sleep mode, a battery configured to provide power to the one or more processors, and a status indicator. The status indicator is located on a surface of the computing device that does not include a programmable display screen configured to display text-based information, and the status indicator is configured to provide, in response an indication from the user activity sensor of an interaction by a user with the computing device, non-text-based information indicating a status of the computing device.

The details of one or more implementations are set forth in the accompanying drawings and the description below. Other features will be apparent from the description and drawings, and from the claims.

DETAILED DESCRIPTION

As described herein, a computing device, such as a laptop or desktop computer can include a visual indicator of an operating status of the computing device. The visual indicator can include a light whose color, brightness, etc. can be used to indicate a status of the computing device. For example, a visual indicator can be used to indicate information about a status update battery that is used to power the computing device. The computing device also can include a sensor that detects a user's activity with respect to the computing device and that activates the visual indicator to provide information about the operating status of the computing device. In some implementations, the sensor can include an accelerometer that can detect motion of the computing device. Then, the sensor can activate the visual indicator in response to a user picking up the computing device or tapping on a surface of the computing device. Thus, a user may receive information about an operating status of the computing device from a visual indicator when needed, but the visual indicator otherwise can remain off so that it does not bother a user when the device is in a dimly lit room.

In some implementations, the visual indicator can include a dynamic, programmable multi-color light-emitting diode (LED). In one implementation, the multi-color LED indicator may be located on a non-display screen area of the computing device. For example, the multi-color LED indicator may be located on the backside of the display portion of the laptop computer (e.g., opposite to the display portion of the laptop computer) or on the backside of a display apparatus of the personal computer (e.g., opposite to the display portion of the display apparatus). Regardless of the location, the multi-color LED indicator may include a plurality of segments, with each segment being capable of displaying a plurality of colors such as green, yellow, and red, among others. As such, the multi-color LED indicator may simultaneously display multiple colors.

Also, according to the implementations, the dynamic, programmable multi-color LED indicator may be configured to display multiple colors to convey particular information to an observer of the computing device. For example, the multi-color LED indicator can be programmed by a user or an administrator of the computing device to convey particular information to people in visual contact with the computing device.

Figure 1:
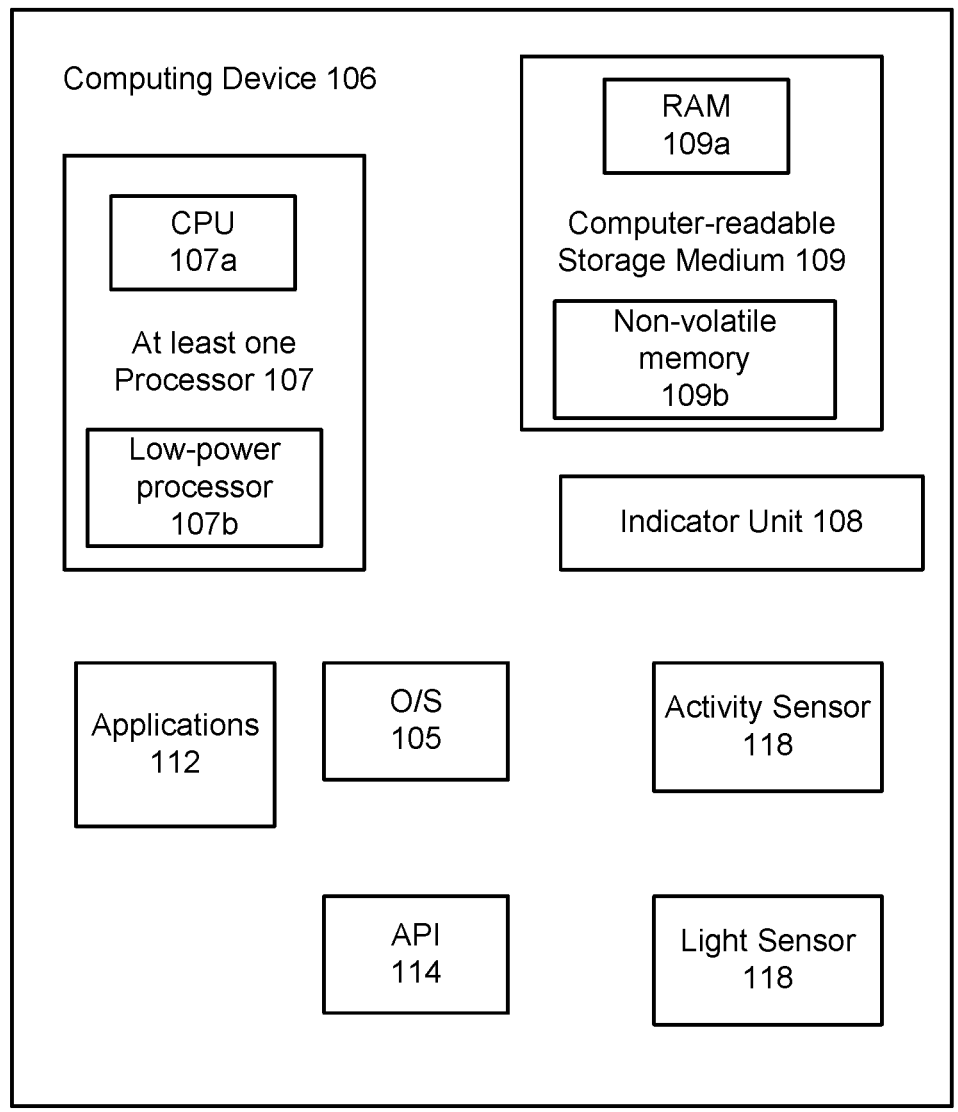
FIG. 1 is a schematic diagram of a computing device that includes a dynamic, programmable multi-color LED indicator.
Figure 3:
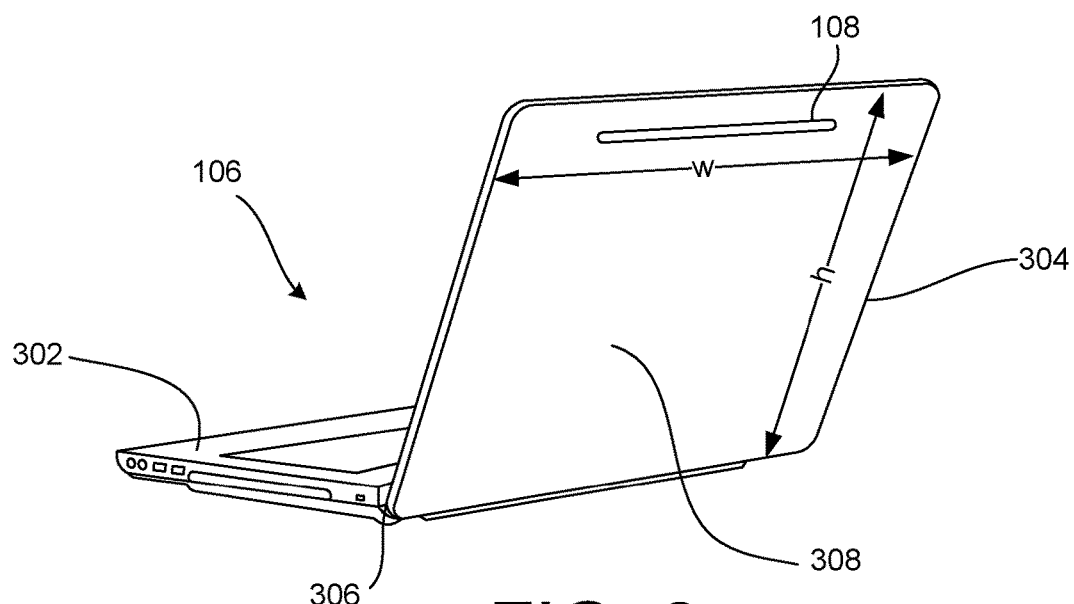
FIG. 3 illustrates the computing device of FIG. 1 configured as a laptop computer.

FIG. 1 illustrates a computing device 106 that includes a dynamic, programmable multi-color LED indicator 108. The computing device 106 may take the form of a laptop computer, a desktop computer, a netbook, a tablet computer, a smartphone, a television, for example. Other forms of the computing device 106 are also possible. An implementation of the computing device 106 as a laptop computer is illustrated in FIG. 3.

The computing device 106 may include an operating system 105, at least one processor 107, and a non-transitory computer-readable storage medium 109. The non-transitory computer-readable storage medium 109 may include executable instructions, that when executed, cause the at least one processor 107 to implement functionalities of the operating system 105, applications 112, and the multi-color LED indicator 108.

The operating system 105 may include an operating system such as the Windows operating system, Mac OS, Linux, Chrome OS, Android, Symbian, or iPhone OS, to name a few examples. Consequently, the applications 112 may include virtually any application that may run on the underlying operating system 105 or platform. Examples of such applications are well-known and too numerous to mention in any detail, but generally include web browsers, document processing applications, gaming applications, email applications, image editing or presentation software, a web browser, and/or virtually any type of application capable of operating on an operating system.

The applications 112 may include or use, or be associated with, one or more Application Programming Interfaces (APIs) to communicate with the LED indicator 108, where such APIs may be light-weight, consistent, customizable, and easy to implement within or among various applications 112. Moreover, such APIs may rarely, if ever, need to be updated or maintained by the user in order for the user to programmably control the operation and display of the LED indicator 108. Instead, such updates may be managed by an administrator or other provider of the LED indicator 108, or the computing device 106, so that the user of the device 106 is unburdened of associated efforts and responsibilities. The operating system 105, the applications 112, and the APIs 114 may issue commands to control the operation of the LED indicator 108, and the commands are provided to the multi-color LED indictor 108 for displaying the color scheme.

Figure 2:
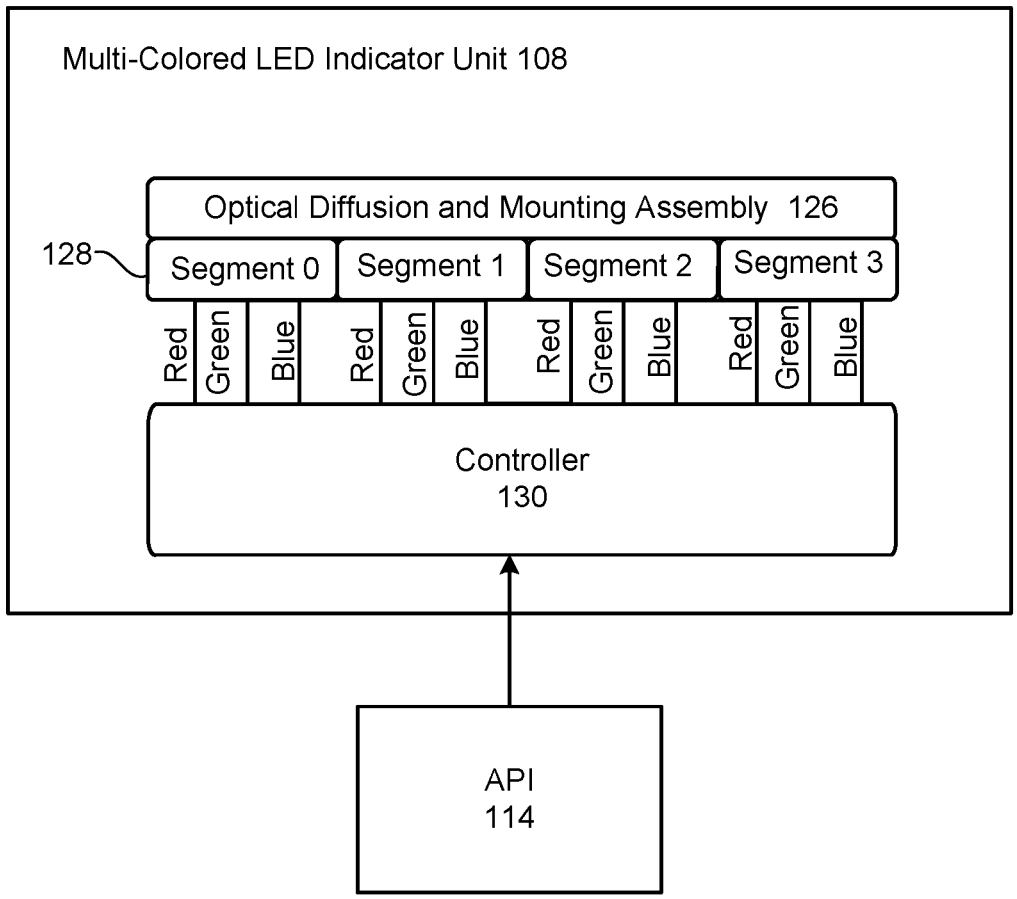
FIG. 2 is a schematic block diagram of the multi-color LED indicator of FIG. 1.

FIG. 2 is a schematic block diagram of the multi-color LED indicator 108 of FIG. 1. According to an implementation, the multi-color LED indicator 108 may include a controller 130, and an optical diffusion and mounting assembly 126 having a plurality of segments. The plurality of segments may include a plurality of independent LED segments such as segment 0, segment 1, segment 2, and segment 3, where each segment is capable of independently displaying a color. Although four segments are shown in FIG. 2, the multi-color LED indicator 108 may include a different number of segments.

Each segment may include different color LEDs. For example, each segment can include a red LED, a green LED, and a blue LED. In some implementations, the colors can be provided separately, such that each segment can display four different colors (e.g., red, green, blue, or black). In other implementations, single level outputs of the different LEDs in a segment can be mixed to produce eight different colors in a segment. In other implementations, the output of the different LEDs can be mixed, and different output levels from the different LEDs can be used, to produce many different colors in a segment. In some implementations, the colors from the LEDs can be mixed to produce at least 64 different colors. In some implementations, the colors from the LEDs can be mixed to produce at least 256 different colors (a.k.a. 8-bit color). In other implementations, the colors from the LEDs can be mixed to produce at least 4096 different colors, at least 32,768 different colors, at least 65,536 different colors, or at least 16 million different colors. As such, the plurality of segments may provide the capability of displaying multiple colors at the same time. The optical diffusion and mounting assembly 126 may include components related to each segment, such as mounting hardware for the red, green, and blue LEDs, electrical and heat-management components, and optical components for diffusing light emitted from the LEDs in the segments 128.

The controller 130 may be an independently-provided controller that is different from the internal controllers associated with controlling single color LEDs on conventional computing devices. The controller 130 may receive commands from operating system 105, the applications, 112, and the APIs 114 and provide the LED-level instructions to the optical diffusion and mounting assembly 126 for displaying the appropriate colors. The LED-level instructions may provide information indicating the appropriate emission pattern(s) for the desired color, brightness, and timing of the individual segments of the LED indicator 108. The LED controller functionality also may also be implemented by a processor 107 executing stored instructions.

As shown in FIG. 2, the multi-color LED indicator 108 may receive commands related to the display of one or more colors of the multi-color indicator to control the illumination of colors. The commands may be in a format or syntax that is recognizable by the controller 130 that controls a light-emitting diode for displaying the appropriate color indicated by the LED display policy. To create a dynamic display using the indicator, the color, brightness, and timing of the light emitted from the segments of the indicator 108 can be controlled with commands issued to the indicator. For example, to create a dynamic pulsing pattern, commands may be issued to the indicator to initially display a first color and then over a first time period to gradually and continuously change the color to a second color while also increasing the brightness of the emitted light, and then over a second time period to gradually and continuously change the color back to the first color while also decreasing the brightness of the emitted light, and then to repeat the process. The color, brightness and timing of light emitted from different segments can be coordinated to display information to the user.

FIG. 3 illustrates the computing device 106 of FIG. 1 configured as a laptop computer. The laptop computer includes a base portion 302, which may include one or more user input devices (e.g., a keyboard, a trackpad, etc.) and a housing that houses electrical components (e.g., one or more memory devices configured for storing executable instructions, one or more processors configured for executing instructions, etc.) and a display portion 304, which may include a high-resolution display screen (e.g., an LED or LCD display screen) that displays information to a user. The display screen can include a large number of independently-controllable pixels (e.g., greater than 380,000 pixels), where the large number of pixels can be controlled to display text-based information to a user. For example, the display screen can display webpages, electronic documents, etc., and other text-based information to a user. The display portion 304 can be attached to the base portion 302 by a hinge 306, such that the display portion 304 can be placed in a closed position when it is parallel to the base portion 302, and can be opened into an open position by rotating the display portion 304 about an axis defined by the hinge 306 relative to the base portion 302.

As shown in FIG. 3, the display portion 304 can have a generally thin rectangular shape, such that it has two primary opposed surfaces. A first surface (not shown) that faces the base portion when the display portion is in the closed position can include the high-resolution programmable display screen that is configured to display text-based information to a user. In some implementations, a second surface 308 that is opposite to the first surface (e.g., a backside of the laptop computer) can include the multi-color LED indicator 108. In other implementations, the multi-color LED indicator 108 can be located elsewhere on the laptop computer. For example, the indicator 108 can be located on a surface of the base portion 302, on the first surface of the display portion 304, or on an edge of the base portion or the display portion.

As shown in FIG. 3, the multi-color indicator 108 can have a generally-rectangular shape, with different segments of the indicator arranged in a line. Individual segments of the indicator 108 also can have generally-rectangular shapes and can be arranged contiguously in a line. In some implementations, the segments of the indicator 108 can be arranged in a single line of segments. In other implementations, the segments of the indicator 108 can be arranged in two or more parallel lines of segments. In some implementations, the length of the generally-rectangular indicator 108 can be at least 50% of the width, w, of the display portion 304. In some implementations, the height of the generally-rectangular indicator 108 can be less than 10% of the height, h, of the display portion 304. In some implementations, the multi-color indicator 108 can have a generally circular shape, with different segments of the indicator having pie-wedge shapes that together form the generally circular shape of the indicator 108. In some implementations, the multi-color indicator 108 can have be generally ring-shaped, with different segments of the indicator having arc shapes that together form the ring shape of the indicator 108.

In some implementations, the computing device 106 can be configured as a tablet computing device, having a display, processing circuitry, a memory device, and a battery integrated in a single unit. The tablet can include a high-resolution, programmable display screen that is configured to display text-based information to a user on one side of the tablet. The multi-color indicator 108 can be provided on an opposite side of the tablet from the high-resolution, programmable display screen.

Figure 4:
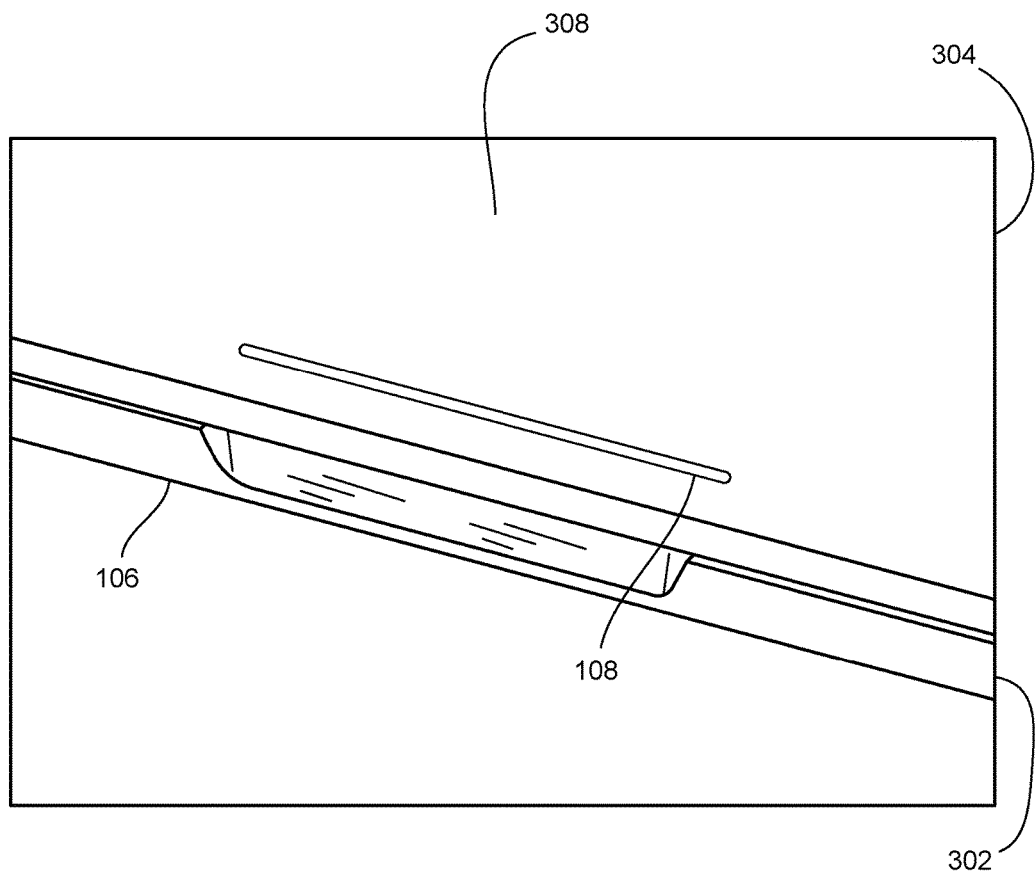
FIG. 4 illustrates the computing device of FIG. 1 according to another implementation.

FIG. 4 illustrates the computing device 106 of FIG. 1 according to another implementation. For example, FIG. 4 illustrates the computing device 106 as the laptop computer, with the laptop computer being in a closed state (e.g., where the display portion 304 and the base portion 302 are folded together, such that the first surface of the display portion that includes the display screen faces the base portion). As shown in FIG. 4, the multi-color LED indicator 108 is located on the second, backside surface 308 of the computer, towards the outer edge of the laptop computer. Again, the locations of the multi-color LED indicator 108, as shown in FIGS. 3 and 4, are merely examples, where the implementations encompass any location of the multi-color LED indicator 108 on the computing device 106.

Referring again to FIG. 1, the multi-color LED indicator 108 is programmable to display non-text-based information in response to instructions received from the operating system 105, applications 112 and the APIs 114. The indicator 108 can be programmable directly by a user of the computing device 106. In some implementations, certain programmability of the indicator 108 can be inaccessible to a general user of the computing device, while the certain programmability can be available to a user with special credentials. For example, certain displays of the indicator can be programmed when the device is configured by a manufacturer of the device, and it may not be possible to unprogram these displays after the device has been delivered to an end-user. In another example, certain displays of the indicator 108 can be programmed only by a user having system administrator credentials within an organization that owns the computing device, and the certain displays cannot be unprogrammed by a general user of the device.

Programming of the indicator 108 is facilitated by the API 114 that translates executable instructions into commands that directly control the color, brightness, timing, etc. of the segments of the indicator 108. In some implementations, the executable instructions can be a snippet of scripting language code (e.g., JavaScript). The scripting language code can be downloaded to the computing device 106 from the Internet 102 or from the private network 104, and then the instructions that the code can be applied to the indicator 108 via the API 114. In response to application of the instructions, non-text-based information can be displayed by the multi-segment, multi-color indicator 108.

The indicator 108 can be used to display a variety of non-text-based information. For example, the indicator may be programmed to indicate a power status of the computing device 106. In one example, when the indicator 108 has a generally rectangular shape, and when the device 106 is connected to a power source to charge a battery of the device, different segments of the rectangular indicator can be repeatedly illuminated sequentially in a blue color from a first end of the indicator to a second end of the indicator 108 to create a sweeping pulse of color to indicate that the device 106 is being charged. The distance over which the rectangular indicator is repeatedly illuminated can indicate the charge status of the device. For example, repeated sequential elimination of the rectangle extending 50% across the entire rectangle from the first end can indicate that the device 106 is charged to 50% of its capacity, and repeated sequential illumination of the rectangle extending 75% across the entire rectangle from the first end can indicate that the device 106 is charged to 75% of its capacity.

When the device 106 is not connected to a power source and is being used, different segments of the indicator can be repeatedly illuminated sequentially in a red color toward the first end of the rectangular indicator to create a sweeping pulse of color to indicate that the device 106 is consuming energy from its battery and that the battery is discharging. The distance over which the rectangular indicator is repeatedly illuminated can indicate the charge status of the device. For example, repeated sequential elimination of the rectangle extending 50% across the entire rectangle toward the first end can indicate that the device 106 is charged to 50% of its capacity, and repeated sequential elimination of the rectangle extending 25% across the entire rectangle toward the first end can indicate that the device 106 is charged to 25% of its capacity.

In some implementations, the rectangular indicator 108 can be oriented toward an AC adapter connection on the computing device, and a blue sweeping pulse of color on the indicator away from the AC adapter connection can indicate that the battery of the device 106 is charging, while a red sweeping pulse of color on the indicator toward the AC adapter connection can indicate the battery of the device is discharging.

In some implementations, the indicator 108 can be used to indicate the presence of email, chat, phone, etc. communications that the user has received. For example, a first color may indicate the presence of a first type of communication (e.g., an email), a second color may indicate the presence of a second type of communication (e.g., a voicemail), etc. On a rectangular shaped indicator, a length of a colored bar indicating the presence of a communication of a particular type can indicate a volume of communications of the particular type (e.g., a number of new emails in the user's inbox). A blinking color may indicate the presence of an urgent communication, where the color indicates a particular type of communication.

A user may program the indicator to display information about particular messages that are of particular importance to the user. For example, the user can program the indicator 108 to display a notification indicating the presence of a communication from a particular person (e.g., a boss or a family member), while programming the indicator not to display notifications of communications from other people. A user may program the indicator to display notifications based on other filter, too.

In some implementations, the indicator 108 can be programmed to provide notifications of events a user has listed in a calendar application. For example, the indicator 108 can be programmed to provide a notification having a particular color, timing, and brightness to indicate that a calendared event is scheduled to begin soon.

In some implementations, indicator 108 can be a single light that provides status information about the computing device 106. For example, the indicator 108 can be a single LED that provides battery status information by, for example, changing color or blinking, or some combination of the two. For example, in some implementations, a blue color of the indicator 108 may indicate a full or nearly full charge (e.g., greater than 85% of full battery capacity). A yellow color may indicate a partial charge (e.g., between 15% and 85% of full battery capacity), and a red color may indicate a nearly depleted battery (e.g., less than 15% of full battery capacity). In some implementations, the light may be illuminated continuously when the battery has a full or nearly full charge, may blink slowly (e.g., with the period of greater than one second) when the battery has a partial charge, and may blink rapidly (e.g., with a period of less than one second) when the battery charge is nearly depleted.

The computing device 106 may include a sensor 118 that senses user activity with respect to the computing device 106. Then, the indicator 108 can be activated in response to a signal from the sensor 118 indicating user activity with respect to the computing device 106. In some implementations, the sensor 118 can include an accelerometer that is configured to detect movement of the computing device 106 in response to an interaction by the user with the computing device. For example, the accelerometer sensor may be configured to generate a signal indicating user activity when a user taps the housing of the computing device one or more times. For example, the signal may be generated when the user taps the computing device three times in rapid succession (e.g., in less than one second). In another example the accelerometer sensor may be configured to generate the signal when the user lifts or moves the computing device 106 from a resting position.

In another implementation, the sensor 118 can include a microphone that is coupled to a voice-recognition application 112 running on the computing device 106. Then, the indicator 108 can be activated in response to receiving a predetermined voice command from the user that is detected by the microphone and recognized by the voice-recognition application 112. For example, a user may state "tell me battery power" or "how much battery is left," and when the voice-recognition application 112 is programmed to recognize these commands, it may generate a signal that can be used to activate the indicator 108.

In response to being activated by the indication from the activity center of an interaction by a user with the computing device, the indicator 108 can provide status information about the computing devices 106. For example, the indicator 108 can provide information about the charge state of a battery within the computing device 106. After the indicator 108 has provided the status information, the indicator 108 can be deactivated. For example, when the indicator 108 includes a light that illuminates to provide the status information, after the status information has been provided, the indicator 108 can be deactivated (e.g., the light can be turned off) after a predetermined period of time (e.g., 3 seconds, 5 seconds, 10 seconds). In this manner, the indicator 108 can be activated to provide the status information in response to an indication from the user activity sensor of an interaction by the user with the computing device, and then the indicator 108 can be deactivated. In this manner, when the indicator 108 includes an illuminating light, the light can be activated only at times at which the light is likely to be useful to the user.

The computing device 106 can include a light sensor 120 located on an exterior surface of the computing device, which determines the amount of light striking the sensor. The light sensor 120 can be configured to generate a signal when amount of light striking sensor is lower than a threshold amount. The signal may be used to control the indicator 108, such that the indicator 108 is deactivated when the amount of light striking the sensor is lower than the threshold amount. In this manner, the indicator 108 can be deactivated when the computing device is in a dimly lit location where an illuminating indicator 108 may be distracting or annoying to a user.

The computing device 106 shown in FIG. 1 may be configured to operate in a number of different power states. Such power states may include one or more active (operating) power states, a low-power sleep state (e.g., a suspend-to-RAM power state or a suspend-to-nonvolatile-medium power state), and a powered-off power state, as some examples. The active power states may include a reduced-power active state, which may be used when the computing device 106 is operating using battery (DC) power (e.g., a battery-power operating state), in order to prolong battery life. The active power states may also include a full-power active state, which may be used when the computing device 106 is operating using alternating-current (AC) power (e.g., an AC-power operating state), such as from a wall outlet. In other embodiments, the computing device 106 may operate in a full-power active state regardless of whether the computing device 106 is operating using battery or AC power. In the reduced-power active state, the computing device 106 may operate at a reduced processing speed, operate at a reduced voltage and operate with brightness of a display device at a lower level as compared with a full-power active state for the computing device 106 in order to increase the time between battery charges.

When the computing device transitions from an active power state to a low power sleep state, the computing device 106 may save operating state information for the computing device 106 to RAM 109a (if the low-power sleep state is a suspend-to-RAM state) or to nonvolatile storage media 109b (if the low-power sleep state is a suspend-to-nonvolatile-media state). When placed in the low-power sleep state, the computing device 106 may be in a non-OS aware state, in which the computing device 106 is no longer in an active (operating) state with the operating system running.

When the computing device 106 is in the low-power sleep state, after the operating state information is saved to RAM 109a or to nonvolatile media 109b, a limited number of the components of the computing device 106 may remain active, including the RAM 109a or the nonvolatile media 109b that is used to preserve the operating state information. Sensor 118 also may remain active, so that the sensor 118 may detect user activity with respect to the computing device, and the computing device may perform limited functions in response to the indication of user activity, even while the computing device remains in the low-power sleep state. The at least one processor 107 may include a low-power processor 107b that performs a few particular functions, including responding to input from the sensor 118 and controlling the indicator 108, but which consumes relatively little power compared to a main processor (e.g., a central processing unit) 107a.

Thus, while the computing device 106 is in the low-power sleep state, input from the sensor 118 may be used to activate the indicator 108 to provide operating state information about the computing device, even while the computing device 106 remains in the low-power sleep state.

Figure 5:
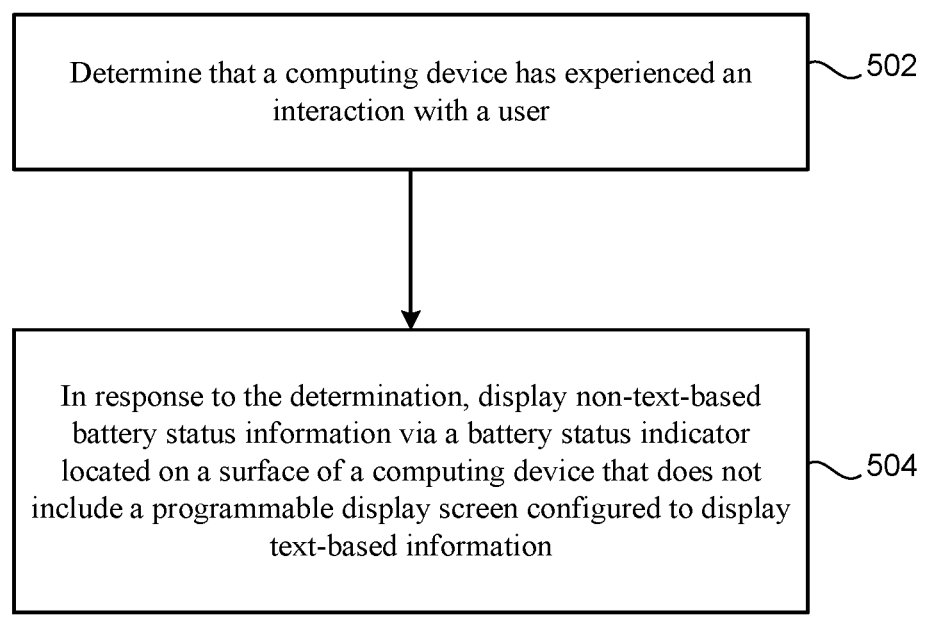
FIG. 5 is a flowchart illustrating example operations of the computing device of FIG. 1.

FIG. 5 is a flowchart illustrating example operations of the computing device 106 of FIG. 1. In particular, the flow chart illustrates a process 500 of displaying non-text-based battery status information via a battery status indicator located on a surface of a computing device that does not include a programmable display screen configured to display text-based information.

In the process 500, while the computing device is in a low power sleep state, it is determined that the computing device has experienced an interaction with a user (502). This determination can be made based on input from a user activity sensor (e.g., an accelerometer that detects movement of the computing device caused by a user or a microphone that detects voice commands from a user). In response to the determination, the non-text-based battery status information is displayed via a battery status indicator (504). In some implementations, the battery status indicator can be a multi-element LED and in some implementations, the battery status indicator can be a single LED.

Figure 6:
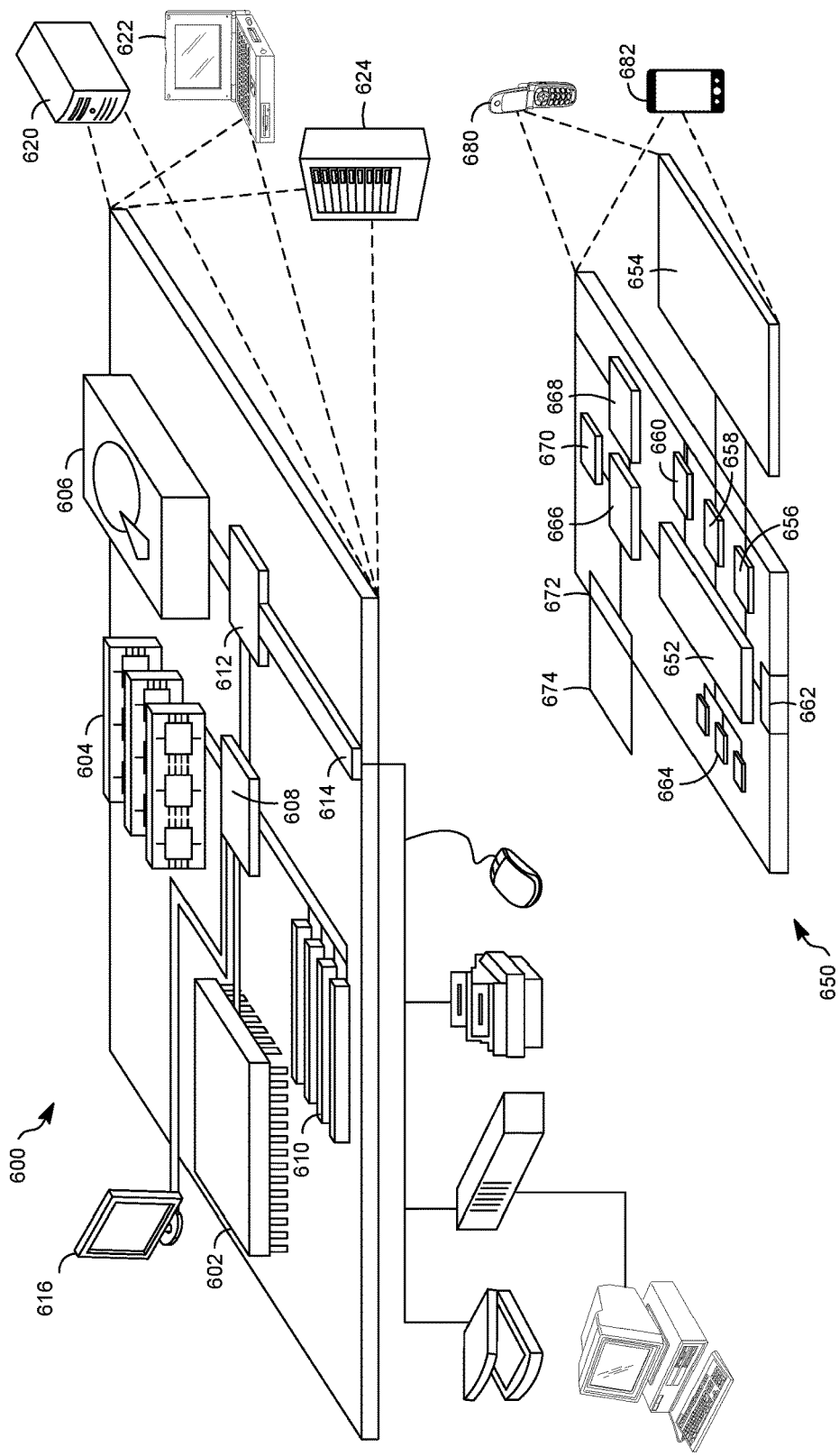
FIG. 6 is a schematic diagram of an example computing device and an example mobile computing device, which may be used with the techniques described here.

FIG. 6 shows an example of a computer device 600 and a mobile computer device 650, which may be used with the techniques described here. Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610 shown, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented in a personal computer such as a laptop computer 622 or a tablet computer. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

It will be appreciated that the above implementations that have been described in particular detail are merely example or possible implementations, and that there are many other combinations, additions, or alternatives that may be included.

Also, the particular naming of the components, capitalization of terms, the attributes, data structures, or any other programming or structural aspect is not mandatory or significant, and the mechanisms that implement the invention or its features may have different names, formats, or protocols. Furthermore, the system may be implemented via a combination of hardware and software, as described, or entirely in hardware elements. Also, the particular division of functionality between the various system components described herein is merely exemplary, and not mandatory; functions performed by a single system component may instead be performed by multiple components, and functions performed by multiple components may instead performed by a single component.

Some portions of above description present features in terms of algorithms and symbolic representations of operations on information. These algorithmic descriptions and representations may be used by those skilled in the data processing arts to most effectively convey the substance of their work to others skilled in the art. These operations, while described functionally or logically, are understood to be implemented by computer programs. Furthermore, it has also proven convenient at times, to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or "providing" or the like, refer to the action and processes of a computer system, or similar electronic computing device, that manipulates and transforms data represented as physical (electronic) quantities within the computer system memories or registers or other such information storage, transmission or display devices.

What is claimed is:

1. A computing device, comprising:
   a base portion;
   a display portion having a frontside surface that includes a programmable display screen configured to display text-based information and having a backside surface opposite to the frontside surface;
   a battery status visual indicator located on the backside surface and including a plurality of individually-controllable segments, wherein each segment is configured to display at least four different colors, wherein each segment is generally-rectangular, and wherein the plurality of segments are arranged in a line having a height that is less than 10% of height of the display portion;
   one or more memory devices storing executable instructions;
   one or more processors configured to execute the instructions;
   a user activity sensor including an accelerometer configured to generate a user activity signal in response to a movement of the computing device;
   a battery configured to provide power to the one or more processors,
   wherein the battery status visual indicator is configured to display, through execution of the instructions by the one or more processors, in response to the generation of the user activity signal, non-text-based information indicating a status of the battery; and
   a light sensor configured to generate a signal when an amount of light striking the light sensor is lower than a threshold amount, wherein the battery status visual indicator is configured to turn off in response to the signal from the light sensor and is configured to turn on and display, for a predetermined time period, in response to the generation of the user activity signal, the non-text-based information indicating a status of the battery.

2. The computing device of claim 1, wherein the battery status visual indicator includes a light emitting diode.

3. The computing device of claim 1, wherein the backside surface on which the battery status visual indicator is located does not include the programmable display screen.

4. The computing device of claim 1, wherein the plurality of segments are arranged contiguously with each other.

5. The computing device of claim 1, wherein each segment is configured to display at least eight different colors.

6. The computing device of claim 1, wherein each segment is configured to display at least 256 different colors.

7. A computing device, comprising:
- one or more memory devices storing executable instructions;
- one or more processors configured to execute the instructions;
- a programmable display screen configured to display text-based information;
- a user activity sensor including an accelerometer configured to generate a user activity signal in response to a movement of the computing device;
- a battery configured to provide power to the one or more processors;
- a status indicator located on a backside surface of the programmable display screen, wherein the status indicator does not include a programmable display screen configured to display text-based information, the status indicator including a plurality of individually-controllable segments, wherein each segment is configured to display at least four different colors, wherein each segment is generally-rectangular, and wherein the plurality of segments are arranged in a line having a height that is less than 10% of height of the display portion, wherein the status indicator is configured to provide, in response to the generation of the user activity signal, non-text-based information indicating a status of the computing device; and
- a light sensor configured to generate a signal when an amount of light striking the light sensor is lower than a threshold amount, wherein the status visual indicator is configured to turn off in response to the signal from the light sensor and is configured to turn on and display, for a predetermined time period, in response to the generation of the user activity signal, the non-text-based information indicating a status of computing device.

8. The computing device of claim 7, wherein status indicator includes a light emitting diode.

9. The computing device of claim 7, wherein each segment is configured to display at least eight different colors.

10. The computing device of claim 7, wherein the plurality of segments are arranged contiguously.

11. The computing device of claim 7, wherein the plurality of segments are arranged contiguously with each other.

12. The computing device of claim 7, wherein each segment is configured to display at least 256 different colors.

13. The computing device of claim 7, wherein line height is less than 10% of height of the display portion.

\* \* \* \* \*